(12) United States Patent  (10) Patent No.: US 7,986,527 B2
Sween et al.  (45) Date of Patent: Jul. 26, 2011

(54) LAPTOP COMPUTER SUPPORT

(75) Inventors: Barry Sween, Santa Monica, CA (US); Richard J. Elgie, Irvine, CA (US)

(73) Assignee: Belkin International, Inc., Playa Vista, CA (US)

( * ) Notice: Subject to any disclaimer, the term of this patent is extended or adjusted under 35 U.S.C. 154(b) by 0 days.

(21) Appl. No.: 12/887,157

(22) Filed: Sep. 21, 2010

(65) Prior Publication Data
US 2011/0051359 A1  Mar. 3, 2011

Related U.S. Application Data

(63) Continuation of application No. 12/184,788, filed on Aug. 1, 2008, now Pat. No. 7,830,661.

(60) Provisional application No. 60/963,031, filed on Aug. 1, 2007.

(51) Int. Cl.
H05K 7/20 (2006.01)
G06F 1/20 (2006.01)

(52) U.S. Cl. .............. 361/695; 361/679.48; 361/679.55; 361/692; 361/694; 454/184; 248/346.01

(58) Field of Classification Search ............ 361/679.46, 361/679.48–679.49, 679.55–679.56, 690, 361/692, 694–695; 53/396; 248/176.1, 346.01, 248/346.03; D14/439, 447
See application file for complete search history.

(56) References Cited

U.S. PATENT DOCUMENTS

| | | |
|---|---|---|
| 2,848,149 A | 8/1958 | Ward |
| D283,323 S | 4/1986 | Cervero |
| D296,852 S | 7/1988 | Buchweitz et al. |
| D312,359 S | 11/1990 | Bradley |
| 4,991,817 A | 2/1991 | VonKleist et al. |
| D328,985 S | 9/1992 | Sheldon |
| 5,143,341 A | 9/1992 | Juster |
| 5,217,119 A | 6/1993 | Hollingsworth |
| D351,748 S | 10/1994 | Stein et al. |
| 5,393,030 A | 2/1995 | Tarozzi |
| 5,542,640 A | 8/1996 | Tarozzi |

(Continued)

FOREIGN PATENT DOCUMENTS

WO  2004104803  12/2004

(Continued)

OTHER PUBLICATIONS

International Search Report, Application No. PCT/US08/72000, 10 pages. Sep. 30, 2008.

(Continued)

*Primary Examiner* — Robert J Hoffberg
(74) *Attorney, Agent, or Firm* — Bryan Cave, LLP

(57) ABSTRACT

Articles for supporting a computer on a user's lap, for cooling the computer, and for isolating the user from heat from the computer. Different embodiments may include a top surface for contacting the computer, a bottom surface for contacting the user's lap, a hollow area, a top aperture through the top surface to the hollow area, a fan, or a combination thereof. The top surface may be at an acute angle to the bottom surface, the fan may include an electric motor powered through a USB cable, or both, as examples. Various embodiments may include at least one side opening or rear opening to the hollow area to allow air to circulate, a foam portion, fabric covering the foam, a plastic portion which provides increased stiffness, or a combination thereof.

21 Claims, 5 Drawing Sheets

U.S. PATENT DOCUMENTS

| Patent No. | Type | Date | Inventor | Ref. |
|---|---|---|---|---|
| D376,787 | S | 12/1996 | Calfee | |
| 5,685,441 | A | 11/1997 | Calfee | |
| D399,834 | S | 10/1998 | Calfee | |
| 5,871,094 | A | 2/1999 | Leibowitz | |
| 5,966,286 | A | 10/1999 | O'Connor et al. | |
| 6,094,347 | A | 7/2000 | Bhatia | |
| 6,170,222 | B1 | 1/2001 | Miller | |
| 6,239,971 | B1 | 5/2001 | Yu et al. | |
| 6,267,236 | B1 | 7/2001 | Seok | |
| D448,950 | S | 10/2001 | McIveen | |
| 6,305,652 | B1 | 10/2001 | Borke et al. | |
| 6,353,536 | B1 | 3/2002 | Nakamura | |
| 6,527,241 | B1 | 3/2003 | Lord | |
| 6,604,618 | B1 | 8/2003 | Godshaw et al. | |
| 6,687,123 | B2 * | 2/2004 | Kitahara | 361/695 |
| 6,707,668 | B2 | 3/2004 | Huang | |
| 6,754,072 | B2 | 6/2004 | Becker et al. | |
| 6,781,833 | B2 | 8/2004 | Lu | |
| 6,894,896 | B2 | 5/2005 | Lin | |
| D511,522 | S | 11/2005 | Toltzman et al. | |
| 7,019,968 | B2 * | 3/2006 | Kitahara | 361/695 |
| 7,035,100 | B2 | 4/2006 | Lord | |
| D522,002 | S | 5/2006 | Cheng | |
| 7,038,909 | B1 | 5/2006 | Chen | |
| 7,106,585 | B2 | 9/2006 | Lin | |
| 7,121,214 | B1 | 10/2006 | Toltzman et al. | |
| 7,161,799 | B2 * | 1/2007 | Lim et al. | 361/679.55 |
| 7,207,540 | B2 | 4/2007 | Thomas | |
| D543,209 | S | 5/2007 | Bae | |
| 7,261,270 | B2 | 8/2007 | Chen et al. | |
| D554,135 | S * | 10/2007 | Lim et al. | D14/447 |
| D555,655 | S | 11/2007 | Iu | |
| 7,301,765 | B2 | 11/2007 | Huang | |
| 7,322,063 | B2 | 1/2008 | Esimai | |
| 7,359,184 | B2 | 4/2008 | Lord | |
| D573,150 | S | 7/2008 | Sween | |
| D573,597 | S | 7/2008 | Shieh | |
| D574,375 | S | 8/2008 | Prest et al. | |
| D578,130 | S | 10/2008 | Sween et al. | |
| 7,453,694 | B2 | 11/2008 | Lee | |
| D593,567 | S | 6/2009 | Benson et al. | |
| D619,139 | S | 7/2010 | Ho | |
| D621,406 | S | 8/2010 | Hoehn et al. | |
| D623,188 | S | 9/2010 | Son et al. | |
| 7,800,903 | B2 | 9/2010 | Wang | |
| 7,830,661 | B2 | 11/2010 | Sween et al. | |
| 2002/0117879 | A1 | 8/2002 | Goodson | |
| 2003/0058615 | A1 | 3/2003 | Becker et al. | |
| 2003/0231466 | A1 | 12/2003 | Huang | |
| 2004/0188289 | A1 | 9/2004 | Woo | |
| 2004/0228086 | A1 | 11/2004 | Lin | |
| 2004/0256535 | A1 | 12/2004 | Desch | |
| 2005/0083650 | A1 | 4/2005 | Yang | |
| 2006/0164806 | A1 | 7/2006 | Huang | |
| 2006/0262497 | A1 | 11/2006 | Jahlokov | |
| 2006/0285283 | A1 | 12/2006 | Simonian et al. | |
| 2007/0091560 | A1 | 4/2007 | Parker | |
| 2007/0215779 | A1 | 9/2007 | Traun | |
| 2007/0258206 | A1 * | 11/2007 | Huang | 361/687 |
| 2008/0007910 | A1 | 1/2008 | Lin | |
| 2008/0037213 | A1 | 2/2008 | Haren | |
| 2008/0061207 | A1 * | 3/2008 | Panziera et al. | 248/346.01 |
| 2008/0084661 | A1 | 4/2008 | Lee | |
| 2008/0142663 | A1 | 6/2008 | Wright et al. | |
| 2008/0173507 | A1 | 7/2008 | Janssen | |
| 2008/0198543 | A1 | 8/2008 | Lord | |
| 2009/0002932 | A1 | 1/2009 | Lord et al. | |
| 2009/0032667 | A1 | 2/2009 | Sween et al. | |
| 2009/0034188 | A1 | 2/2009 | Sween et al. | |
| 2009/0178783 | A1 | 7/2009 | Lin | |
| 2009/0179131 | A1 | 7/2009 | Lord et al. | |
| 2009/0212180 | A1 | 8/2009 | Lord | |
| 2010/0079945 | A1 | 4/2010 | Wang | |
| 2010/0270188 | A1 * | 10/2010 | Dotson | 206/320 |
| 2011/0013358 | A1 | 1/2011 | Huang | |

FOREIGN PATENT DOCUMENTS

| | | |
|---|---|---|
| WO | 2009002563 | 12/2008 |
| WO | 2009018545 | 2/2009 |
| WO | 2009091569 | 7/2009 |

OTHER PUBLICATIONS

International Search Report, Application No. PCT/US08/72014, 9 pages. Oct. 22, 2008.

Belkin: CushTop, http://www.belkin.com/laptopathome/cushtop/, 1 page. Jun. 15, 2007.

VAIO, VGP-VST1, http://www.ecat.sony.co.jp/vaio/acc/acc.cfm?PD=26608, 3 pages May 31, 2007.

Belkin: CushTop Hideaway, http://catalog.belkin.com/IWCatProductPage.process?Product_Id=459905, 1 page Jul. 31, 2008.

Review: Belkin Cushtop Laptop Stand, http://www.philoking.com/2007/09/30/review-belkin-cushtop-laptop-stand/, 5 pages. Sep. 30, 2007.

Logitech Speaker Lapdesk N700, http://www.logitech.com/en-us/notebook-products/cooling-pads/devices/6564, 4 pages. Printed Oct. 12, 2010.

Targus Lap Chill Mat, http://www.targus.com/us/product_details.aspx?sku=AWE55US, 4 pages. Printed Oct. 12, 2010.

"Belkin F8N044-BRN CushTop Notebook Stand (Chocolate/Blue)", printed from http://www.amazon.com/Belkin-F8N044-BRN-CushTop-Notebook-Chocolat/dp/B000P1R9QM on Feb. 16, 2011.

* cited by examiner

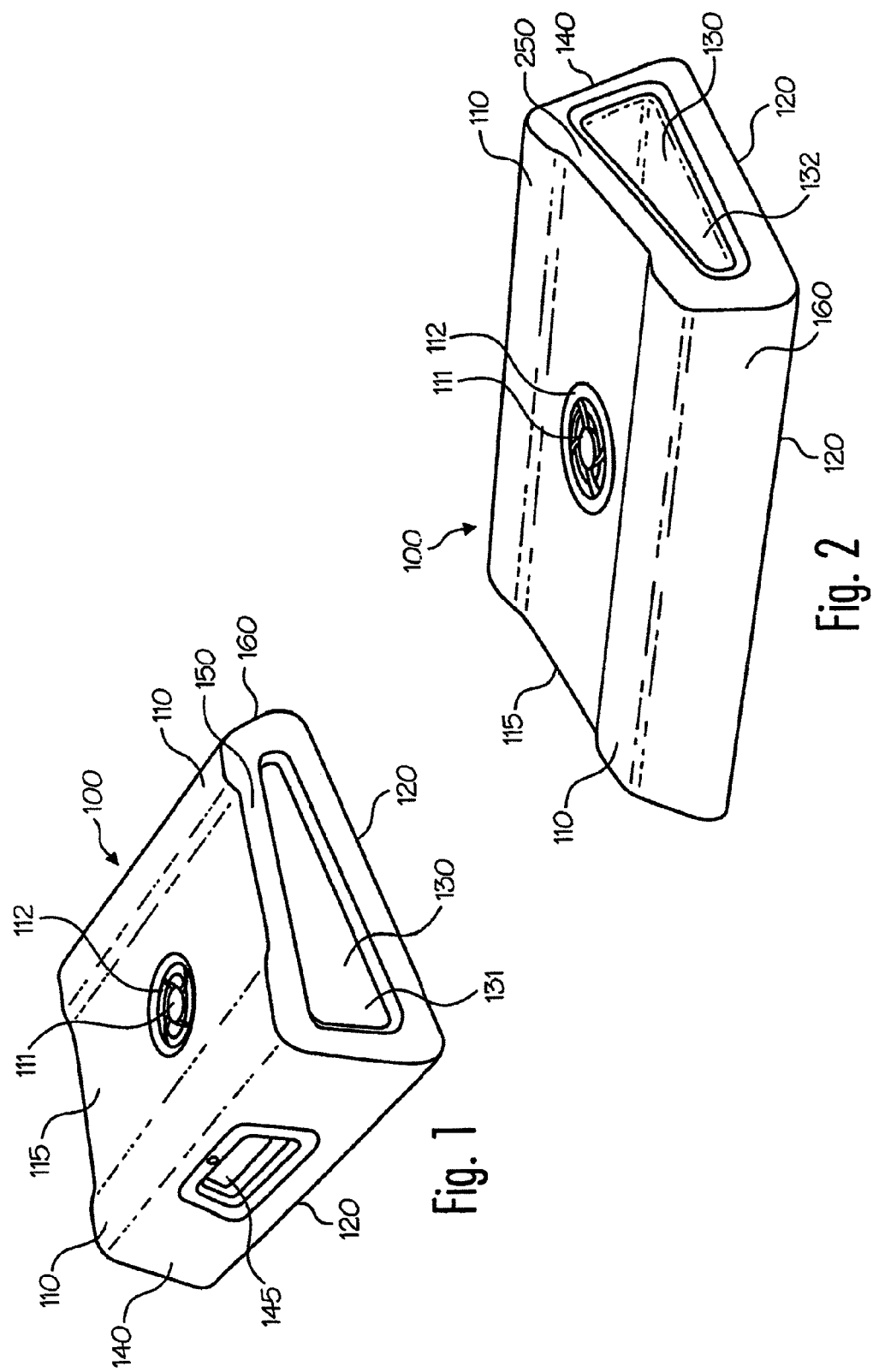

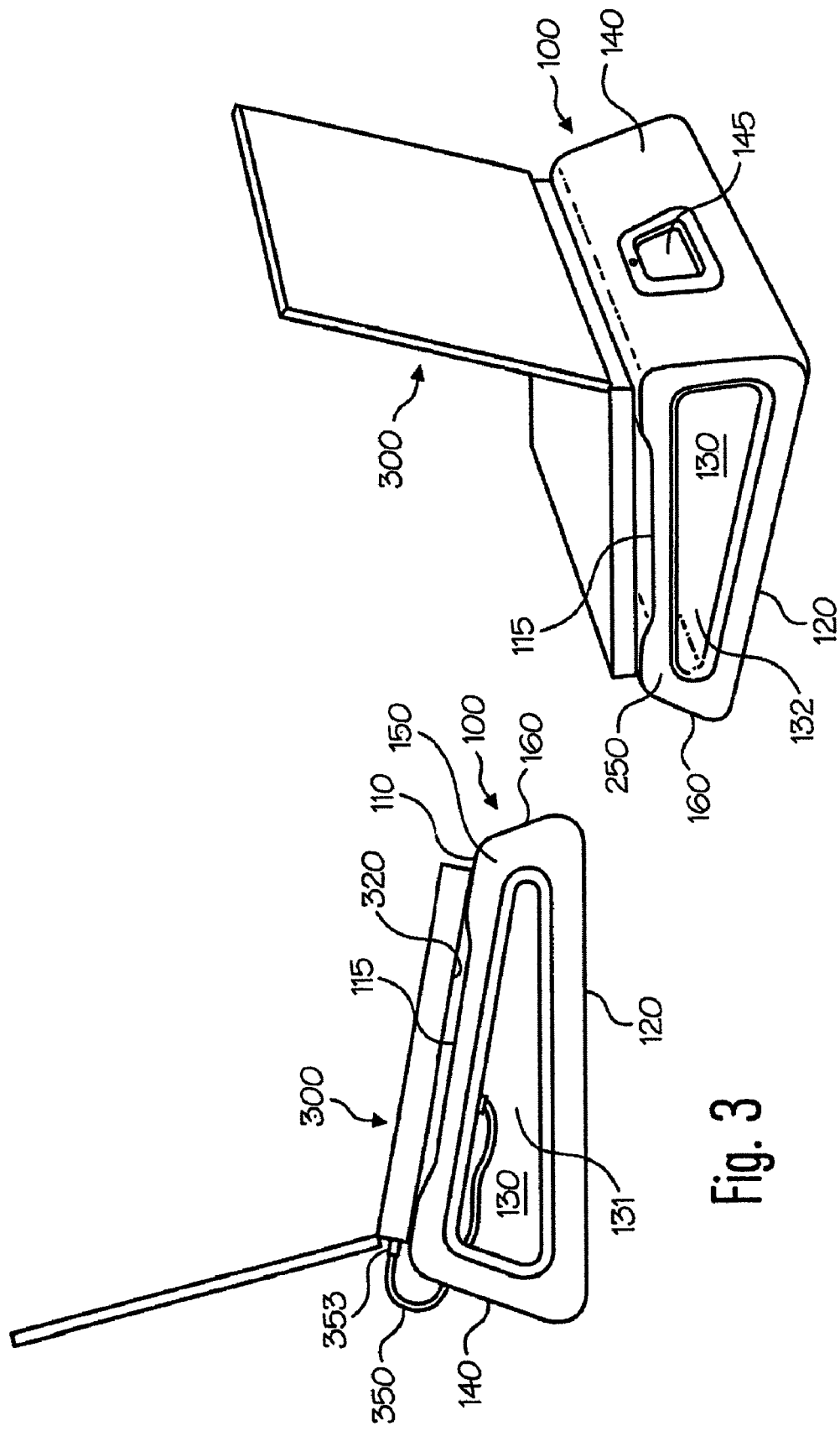

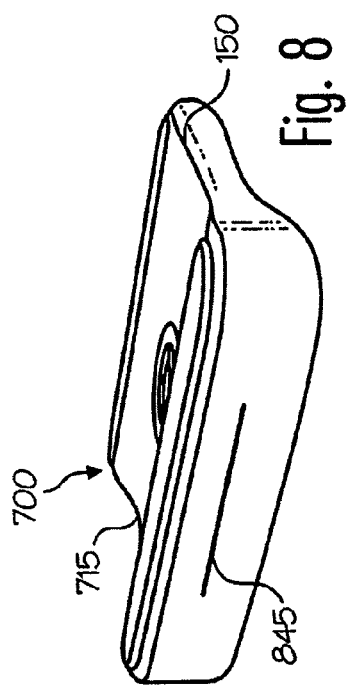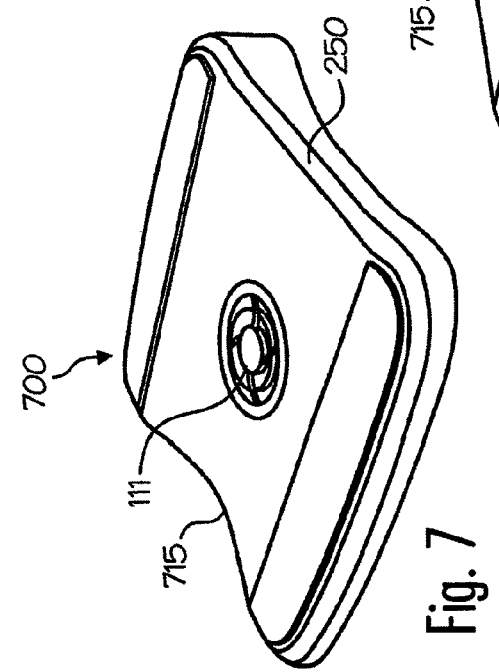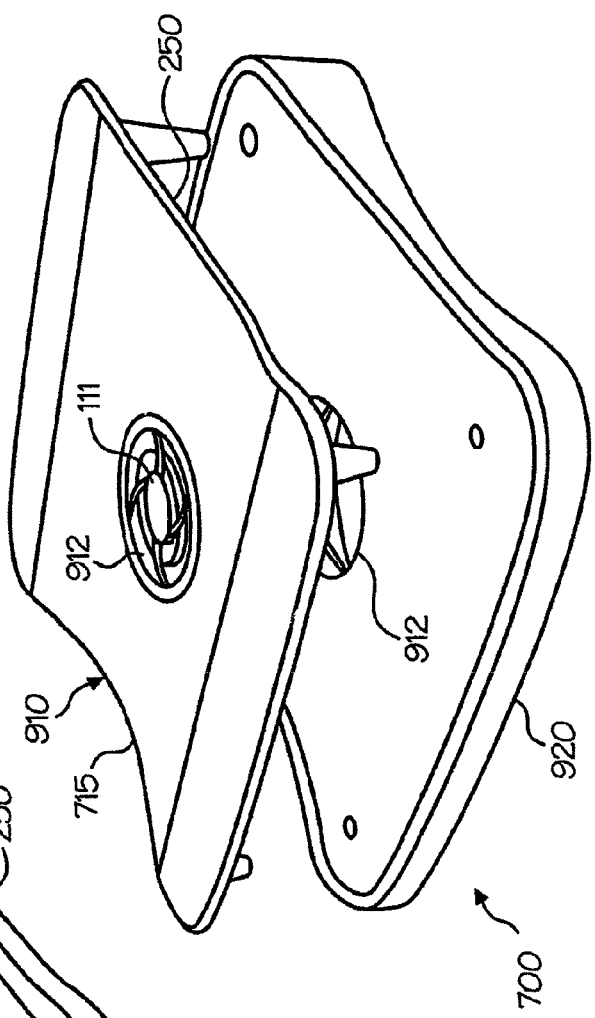

LAPTOP COMPUTER SUPPORT

RELATED APPLICATIONS

This patent application is a continuation of, and claims priority to, U.S. patent application Ser. No. 12/184,788 filed on Aug. 1, 2008 now U.S. Pat. No. 7,830,661, which claims priority to U.S. provisional patent application 60/963,031 filed on Aug. 1, 2007, and to U.S. design patent application 29/289,811 also filed on Aug. 1, 2007, which issued on Oct. 7, 2008 as D578130, all having the same title, inventors, and assignee. This patent application is also related to, and claims priority to, U.S. patent application Ser. No. 12/874,989 filed on Sep. 2, 2010, which also claims priority to U.S. patent application Ser. No. 12/184,788 filed on Aug. 1, 2008. All of these patent applications are incorporated by reference herein in their entirety.

FIELD OF THE INVENTION

This Invention relates to devices for supporting computers while the computers are in use.

BACKGROUND OF THE INVENTION

In the past, laptop computers have been placed directly on user's laps when in use, as well as on desks, tables, and the like. The ability to use a laptop computer directly on one's lap has allowed users to use laptop computers in locations where computer use would otherwise not be possible, or as convenient, such as in vehicles, such as cars, busses, trains, subways, air planes, boats, and the like. Users have also used laptop computers in locations where computers were not traditionally used, such as in living rooms, on sofas, in recliners, in arm chairs, on the porch, on a deck, on a balcony, by the pool, in yard furniture, etc.

Use of laptop computers in such locations has allowed computer users to interact with other people in a more social atmosphere, while using the computer, and use of laptop computers in such situations has expanded their scope of use. For example, a computer user can use a laptop while watching television to research (e.g., through the Internet via a wireless connection) subjects being discussed on the television program, can read e-mails during commercials, can show images on the computer to others in the room, etc.

Laptop computers, however, generate heat while in use, at least a portion of which has traditionally been dissipated through the bottom of the computer. Such heat has commonly been transferred to the user's lap or legs. Such heat may be welcome in a cool environment, but in warmer environments is unwelcome or uncomfortable. In some situations, users have had to turn down thermostats on air conditioning units to provide for an environment in which having a warm laptop computer on one's lap is not uncomfortable. Such thermostat adjustments have resulted in greater electrical energy consumption.

In addition, the bottoms of laptop computers have traditionally been hard, and are not necessarily contoured to fit the shape of a user's lap or legs. Thus, having a laptop computer directly on a user's lap may be uncomfortable for these reasons as well. Furthermore, for many users, having a laptop computer directly on their lap may result in the keyboard, screen, or both, being too low ergonomically. A user may need to reach lower than desired to use the keyboard such a computer, or may need to bend their head downward more than desirable, putting a strain on their neck or back, as examples.

Thus, needs and potential for benefit exist for systems and devices that support laptop computers above a user's lap or legs, that insulate a user from the heat from (e.g., the bottom of) a laptop computer, or a combination thereof, as examples. Needs and potential for improvement exist for such systems and devices that are relatively inexpensive to manufacture, that are easy to use, and that are durable, safe to use, aesthetically appealing, and versatile. Room for improvement exists over prior art in these and other areas that may be apparent to a person of ordinary skill in the art having studied this document.

SUMMARY OF PARTICULAR EMBODIMENTS OF THE INVENTION

This invention provides, among other things, various articles for supporting laptop computers that a user can use on their lap between their laptop computer and their body, and various methods concerning such articles, including methods of manufacture. Particular embodiments provide, as objects or benefits, for example, that they support laptop computers above a user's lap or legs, that they insulate a user from the heat from (e.g., the bottom of) a laptop computer, may cool the computer, or a combination thereof. A number of embodiments provide such systems and devices that are relatively inexpensive to manufacture, that are easy to use, and that are durable, safe to use, aesthetically appealing, and versatile. Other benefits to certain embodiments may be apparent to a person of ordinary skill in the art.

In a variety of specific embodiments, this invention provides, among other things, various articles for supporting a computer on a user's lap, for cooling the computer, and for isolating the user from heat from the computer. In specific embodiments, such an article may include, for example, a top surface for contacting the computer, a bottom surface for contacting the user's lap, a hollow area between the top surface and the bottom surface, at least one top aperture extending through the top surface to the hollow area to allow airflow between the hollow area and the computer, and a fan located in the top aperture to move air through the top aperture between the hollow area and the computer. In a number of embodiments, the top surface of the article is at an acute angle to the bottom surface, and there may be at least one side opening or rear opening to the hollow area to allow air to circulate through the hollow area and through the top aperture. Further, in various embodiments, the fan includes an electric motor connected to the fan, and the electric motor may be powered through a USB cable when the USB cable is plugged into a USB port in the computer.

In particular embodiments, a recess in the top surface may allow air to circulate by the computer. In certain embodiments, for example, the top surface of the article has a left side, a right side, a front side, and a back side, and the recess extends from the left side to the right side. In various embodiments, the computer may be supported continuously along the front and the back by the top surface, for instance. Further, in some embodiments, the article includes a right side opening to allow air to circulate through the hollow area and through the top aperture, and the article further includes a left side opening opposite the right side opening to allow air to circulate through the hollow area. Moreover, in some embodiments, the article specifically includes a rear opening to the hollow area to allow air to circulate through the hollow area and through the top aperture. In fact, some embodiments include a combination of such openings, for example.

Other specific embodiments of an article may include, for example, a foam portion, fabric covering at least a portion of the foam, and a plastic portion which provides substantially increased stiffness to the article. Such embodiments may also include a top surface for contacting the computer, a bottom surface for contacting the user's lap (e.g., at an acute angle to the top surface of the article), a hollow area between the top surface and the bottom surface, and at least one top aperture extending through the top surface to the hollow area to allow airflow between the hollow area and the computer. Such an article may further include at least one side opening or rear opening to the hollow area to allow air to circulate through the hollow area and through the top aperture.

Some such embodiments may further include a fan, for example, in the top aperture to move air through the top aperture between the hollow area and the computer. In a number of embodiments, the fan may include, for instance, an electric motor connected to the fan, and the electric motor may be powered through a USB cable when the USB cable is plugged into a USB port in the computer, for example. Further, a number of embodiments may include a recess in the top surface to allow air to circulate by the computer, and the recess may extend from the left side to the right side. In some embodiments, the computer may be supported continuously along the front and the back by the top surface, for example.

Moreover, in a number of embodiments, the foam portion is tubular and the article includes a first side opening to allow air to circulate through the hollow area and through the top aperture. Additionally, some embodiments may include a second side opening opposite the first side opening to allow air to circulate through the hollow area. Further, various embodiments may include, in addition, or instead, a rear opening to the hollow area to allow air to circulate through the hollow area and through the top aperture. Even further, in some embodiments, the plastic portion lines the hollow area, and in particular embodiments, the plastic portion has a cross section, when viewed from a right side or from a left side, having rounded corners.

Still other specific embodiments of articles for supporting a computer on a user's lap, for cooling the computer, and for isolating the user from heat from the computer, include a foam portion, a plastic portion which provides substantially increased stiffness to the article, a top surface for contacting the computer, and a bottom surface for contacting the user's lap. In various embodiments, the top surface of the article is at an acute angle to the bottom surface and the bottom surface includes the foam. Moreover, a number of these embodiments include at least one top aperture extending through the top to allow airflow between the hollow area and the computer, a fan positioned and configured to move air through the top aperture to cool the computer, and a rear opening to the fan to allow air to circulate through the top aperture to cool the computer.

Certain embodiments further include fabric covering the foam. The bottom surface may include the foam covered with the fabric, for example. Moreover, some embodiments include a hollow area between the top surface and the bottom surface to allow air to circulate through the rear opening, through the fan, and through the top aperture, for instance, to cool the computer. In particular embodiments, the plastic portion defines the hollow area, and in some embodiments, the top surface (e.g., for contacting the computer) includes the plastic portion. Furthermore, some embodiments include an electric motor connected to the fan, which may be powered through a USB cable plugged into a USB port in the computer, for instance. In certain embodiments, for example, the USB cable passes through the rear opening when the USB cable is plugged into a USB port in the computer. Still further, in various embodiments, the fan is located in the top aperture, the top surface is shaped so that the computer is supported continuously along the front and the back by the top surface, or both.

In addition, various other embodiments of the invention are also described herein.

BRIEF DESCRIPTION OF THE DRAWINGS

FIGS. 1 to 6 illustrate an example of an embodiment of a an article for supporting a computer on a user's lap. Specifically, FIG. 1 is an isometric view showing the back, top, and left side of this embodiment of the article. In addition, FIG. 2 is an isometric view showing the front, top, and right side of this embodiment of the article. Furthermore, FIG. 3 is a left side view showing a laptop computer on this same embodiment of the article or support device, and FIG. 4 is an isometric view showing the back, top, and right side of the article, in this same embodiment, and also showing a laptop computer on the article. Moreover, FIG. 5 is an isometric view showing the back, top, and right side of this same embodiment of the article, without a laptop computer on the article, and FIG. 6 is an exploded isometric view of this embodiment of the article showing the various components of the article.

Furthermore, FIGS. 7 to 9 are isometric views of another embodiment of a computer support device or an article for supporting a computer on a user's lap.

FIG. 7 shows the front, top, and right side of this embodiment, and

FIG. 8 shows the top, back, and left side. In addition,

FIG. 9 shows the front, top, and right side of this same embodiment of the article, in a partially exploded view. Further.

Further still.

DETAILED DESCRIPTION OF EXAMPLES OF EMBODIMENTS

Figure 5:
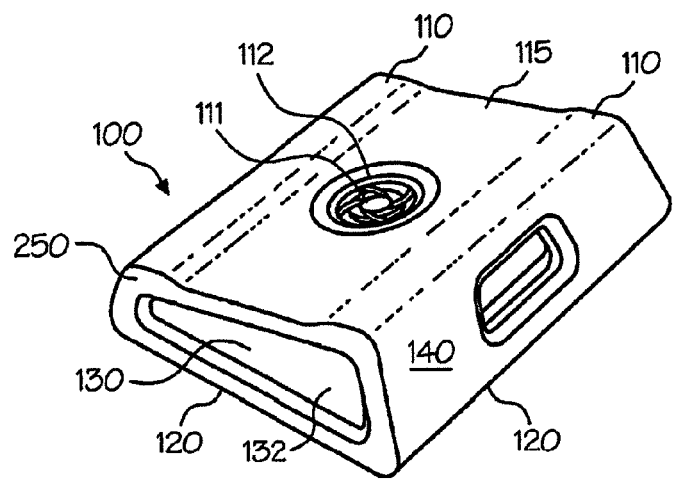

FIGS. 1 to 6 illustrate an example of an article or support 100 for a laptop computer 300 (FIGS. 3 and 4) that a user can use on their lap between their laptop computer (e.g., 300) and their body, for example to raise the computer (e.g., 300), prevent heat transfer from the computer (e.g., 300) to the user, change the angle of the computer (e.g., 300), provide for better cooling of the computer (e.g., 300), or a combination thereof, as examples. In many embodiments, support 100 can also (e.g., alternately) be placed on a desk, table, coffee table, ottoman, foot rest, chair, end table, counter, chaise lounge, automobile hood, ice chest, or the like, rather than on the user's lap, and used to support a computer (e.g., 300) while the computer is being used (e.g., to provide improved ergonomics).

In the embodiment illustrated, support 100, for example, includes top surface 110 that the computer (e.g., 300) sits on, bottom surface 120 that sits on the user's lap or legs (or another surface), and hollow area 130 between top surface 110 and bottom surface 120. In the embodiments depicted, top surface 110 is set at an angle to bottom surface 120 (e.g., as shown in FIG. 3). In many embodiments, top surface 110 is not parallel to bottom surface 120. Further, many embodiments include at least one recess or indentation, such as indentation 115 shown in top surface 110, for example, to allow air to circulate and reach at least part of the bottom 320 of the laptop computer 300. In addition, or instead, some embodiments include at least one aperture, such as aperture 112 (see FIG. 6) through top surface 110, for instance, to allow air to travel from hollow area 130 to bottom 320 of computer 300 (or in the opposite direction, in some embodiments).

Numerous embodiments include a fan, such as fan 111 (e.g., located in or near aperture 112), for example, that moves air to, across, or past bottom 320 of computer 300, for instance. In different embodiments, fan 111 may be an axial, centrifugal, or mixed flow fan, for example, and may be driven (e.g., on a common shaft) by an electric motor (e.g., motor 1013 shown in FIG. 10), which may be an AC or DC motor, for instance. Fan 111 may include fan blades, that may be plastic, for instance. In different embodiments, fan 111 may be a single-speed fan, a two-speed fan, a three-speed fan, a variable-speed fan, or the like (e.g., with a corresponding motor 1013).

In some embodiments, article or support 100 or fan 111 may include a thermostat, which may turn fan 111 (e.g., or motor 1013) on and off, alter the speed or torque of fan 111 (e.g., or motor 1013), or both, for example, in response to the temperature of back 320 of computer 300, the air at fan 111, or a combination thereof, as examples. In other embodiments, fan 111 may operate all of the time when plugged in (e.g., via plug 353 shown in FIGS. 3 and 10), or a switch may be provided (e.g., at fan 111, within cord 350 described below, or within support 100) to turn fan 111 on or off manually. In some embodiments, fan 111 may be powered by or controlled by computer 300, for example, via a USB cable (e.g., 350).

As illustrated, some embodiments include at least one back wall, such as back wall 140 shown in FIGS. 1, 3, 4, 5, and 6 that extends, for example, from bottom 120 to top 110. In the embodiment illustrated, wall 140 includes (e.g., rear) opening 145, which may provide, for example, for the movement of air (e.g., to or from hollow area 130), provide a passageway for one or more cables (e.g., to fan 111), or both. In some embodiments, fan 111 may be located at or in back wall 140 or opening 145, as another example. In such embodiments, support 100 may include ducting from the fan to one or more openings or apertures (e.g., 112), for instance, in top surface 110, or the left and right sides may be covered or closed. In other embodiments, fan 111 may be located at or within bottom 120, within hollow 130, at the right or left side, or in another location, as other examples. Some embodiments may omit wall 140, but may have another structure between top 110 and bottom 120, as another example.

In the embodiment illustrated, article or support 100 also includes front wall 160, which as shown in FIG. 3, for example, may not be as tall as back wall 140. In this embodiment, top surface 110 and bottom surface 120 are not parallel to each other. As used herein, in this context, not parallel means not parallel by at least 10 degrees. In various embodiments, top surface 110 is not horizontal or is at an acute angle to bottom surface 120. In the embodiment illustrated, as shown in FIG. 3, for instance, Front wall 160 and rear wall 140 are not vertical, but rather, lean in toward the center, so that bottom surface 120 has a greater horizontal dimension from front to back than top surface 110, rendering article or support 100 more stable than would otherwise be the case.

Further, in the embodiment illustrated, article or support 100 also includes left side 150 and right side 250, which, in this embodiment, are angled slightly from vertical. As used herein, words that indicate direction, such as vertical, horizontal, above, below, taller, side, front, back, etc., assume that the article is placed on a horizontal surface in its normal orientation when being used to support a computer, such as shown in FIG. 3, for example. In the embodiment illustrated, as shown in FIG. 3, for instance, left side 150 and right side 250 lean in toward the center, so that bottom surface 120 has a greater horizontal dimension from left to right than top surface 110, rendering article or support 100 more stable than would otherwise be the case.

In the embodiment illustrated, indentation 115 in top surface 110 extends from left side 150 to right side 250, as shown. Further, in the embodiment illustrated, there is one indentation 115 and computer 300 is supported at the front and the back by top surface 110. Other embodiments may have multiple indentations, multiple top apertures through the top surface, or both, for example. In embodiments having multiple indentations, the indentations may each extend from the left side to the right side or indentations may connect, as examples. In various embodiments, one or more indentations may extend from front to back (e.g., from front wall 160 to back wall 140), at an angle, or from front to side or back to side, or one or more indentations may not extend to a side, front or back, but may extend past the dimensions of computer 300, as another example.

Figure 6:
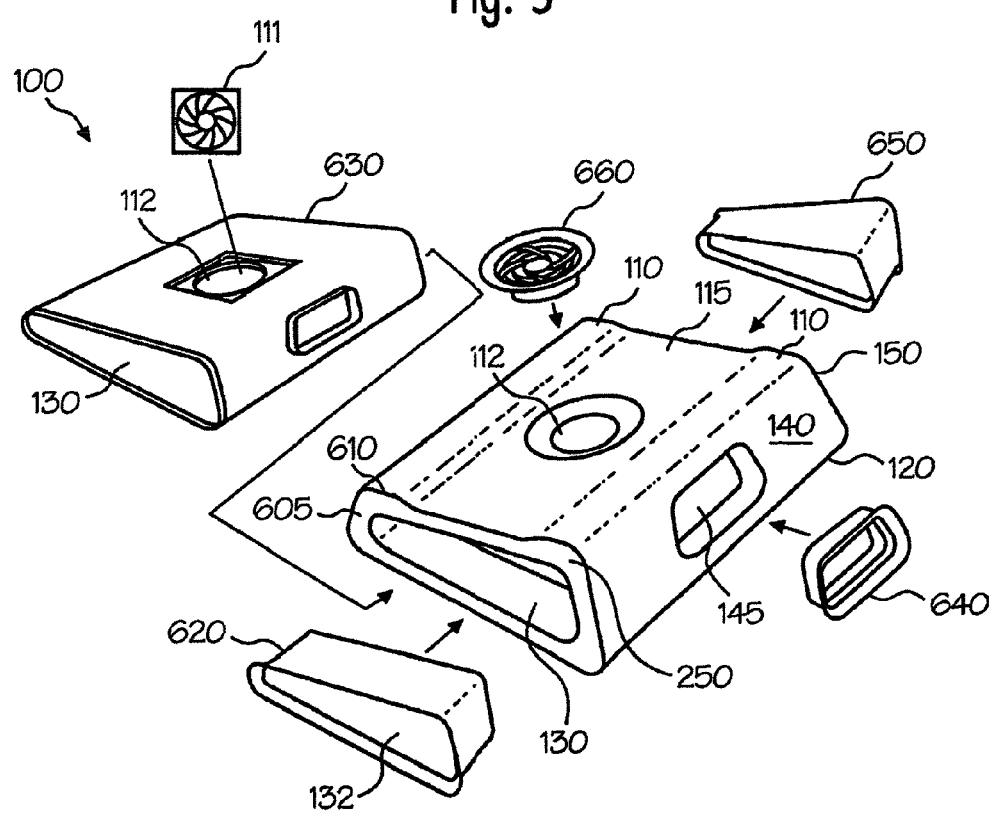

Referring to FIG. 6, in the embodiment illustrated, support 100 includes body 605, which in certain embodiments, is made of foam, and may be covered with fabric 610. Body 605 may be open cell foam, such as foam rubber, or may be closed-cell foam, in different embodiments. Fabric 610 may be polyester, rayon, nylon, cotton, vinyl, leather, halpalon, Kevlar, or the like, or a combination thereof, as examples, and may be coated in some embodiments. Fabric 610 may be stitched or glued, as examples, to itself, to body 605, or to other components. In different embodiments, fabric 610 may be woven or knitted, or may be a single sheet of monolithic material, which in some embodiments, may be fiber reinforced, as examples.

In certain embodiments, hollow area 130 is lined with core or liner 630, which may be made of a more rigid material, such as plastic, and may provide stiffness to support 100. In the embodiment illustrated, support 100 also includes right and left end caps 620 and 650 which attach to or fit concentrically with liner 630 on the right and left sides (e.g., 250 and 150) of support 100 respectively. Also in this embodiment, back cap 640 attaches to or fits within opening 145. Liner 630, end caps 620 and 650, back cap 640, or a combination thereof, may be made of a thermal plastic, a thermal set plastic, polyethylene, high-density polyethylene, nylon, or the like, and may be fiber reinforced in some embodiments. In particular embodiments, end caps 620 and 650, back cap 640, or a combination thereof, may attach to liner 630, for example, via glue, fasteners, staples, pins, snaps, hook and loop fasteners, or an interference or snap fit, or a combination thereof, and in some embodiments, end caps 620 and 650, back cap 640, or a combination thereof, may contain, cover, or attach to the ends of fabric 610, or a combination thereof, for example.

Fan 111 may fit within, adjacent to, or within a passageway to, aperture 112, and may attach to liner 130, body 605, fabric 610, or a combination thereof. Fan grill 660 may cover, attach to, or be part of fan 111, and may fit within or adjacent to aperture 112, may attach to liner 130, body 605, fabric 610, or a combination thereof, for example. In some embodiments, fan 111 is powered through a cord 350 (shown in FIGS. 3 and 10) that extends from fan 111 to, for example, a receptacle or port, such as a USB port in or on computer 300. In some embodiments, cord 350 may be permanently attached to fan 111. In other embodiments, a jack may be provided at or near fan 111 or motor 1013 which cord 350 may plug into. In some such embodiments, cord 350 may be a USB cord or a mini USB cord, and a corresponding jack may be provided at, near, or electrically connected to, fan 111 or motor 1013, for example. In some embodiments, cord 350 may pass through opening 145, for example. In other embodiments, cord 350, or a similar cord, may pass through body 605, between body 605 and liner 630, between body 605 and fabric 610, through a passageway in liner 630, or the like. In other embodiments, fan 111 may be powered by batteries located within support 100, or by a 110 Volt AC power cord, as other examples.

In some embodiments, support 100, body 605, fabric 610, hollow area 130, liner 630, end caps 620 and 650, or a combination thereof, may be tubular, for example, with a cross section that is a quadrilateral, a trapezium (i.e., a quadrilateral with no two parallel sides), a triangle, or the like, which may have rounded corners, and may have substantially square ends. In some embodiments, the ends may lean in at the top, forming a trapezoid (e.g., having a parallel top 110 and bottom 120 from one or more points of view) or an isosceles trapezoid (e.g., having the right and left sides leaning at the same angle) when viewed from the front or back. Computer 300 shown in FIGS. 3 and 4 provides a sense of scale for the embodiment illustrated, and body 605 may be about 1-inch thick, in particular embodiments. In other embodiments, body 605 may be ¼, ½, ¾, 1¼, 1½, or 2 inches thick, as other examples, or a thickness therebetween. Opening 145, back cap 640, or both, may have a cross section that is round, square, rectangular, trapezoidal (e.g., an isosceles trapezoid), or the like, which may have rounded corners, for instance.

The embodiment illustrated includes a single recess or indentation 115 that allows air to circulate past a majority of back 320 of computer 300. In this embodiment, computer 300 is supported at the front and back of the keyboard only. In other embodiments, more than one recess or indentation may be provided, computer 300 may be supported at more or different locations, or the like. Further, in the embodiment illustrated, air from recess 115, from fan 111, is directed out the sides (e.g., the right and left sides) of support 100 (e.g., between top surface 110 and computer 300. In other embodiments, air is directed in other directions, for example, towards the back, up, or at an angle up and towards the back, or a combination thereof. In other embodiments, fan 111 blows air downward which is then directed out opening 145, through end caps 620, 650, or both, or a combination thereof, as examples.

In some embodiments, top surface 110 includes a non-slip material or surface (e.g., where computer 300 contacts top surface 110, for instance, outside of indentation 115) to help prevent computer 300 from moving or sliding off of support 100. In some embodiments, such a non-slip surface covers top surface 110. In other embodiments, the non-slip surface just covers some or all portions of top surface 110 other than recess 115. In some embodiments, all of fabric 610 may include a non-slip surface, as another example. A non-slip surface may include an elastomer or a coating (e.g., printed or applied) on fabric 610, for example, or another layer of fabric material that may be sewn or glued to fabric 610, as examples.

Support 100 (or other embodiments) may include storage areas for various devices or items, including, for example, for computer peripheral devices or the like. For example, in some embodiments, support 100 may include (e.g., within hollow area 130, body 605, liner 630, or a combination thereof), pockets or compartments for storage for computer 300 itself, a mouse, a power supply (e.g., for computer 300), pens, pencils, one or more computer cables or USB cables, one or more disks, CDs, or DVDs, one or more memory sticks, a remote control, a mobile or cordless phone, papers, books, a note pad, food, canned or bottled beverages, eye glasses, cash money, jewelry, credit, debit, or identification cards, tissues, medications, or other personal items, or a combination thereof, for instance. In some embodiments, support 100, or other embodiments, may include handles (e.g., like brief case or luggage handles) to facilitate carrying the support (e.g., when one or more of the objects described herein, or other objects, are stored inside).

In some embodiments, the sides or end caps (e.g., 620, 650, or both), may be closed or may contain doors, closable openings, coverings, or the like, for instance, to facilitate storage within core 130, to direct ventilation air (e.g., from or to fan 111), or both. In some embodiments, fabric 610 may include pockets (e.g., sewn, glued, or plastic welded). Some embodiments may include zippers, hook-and-loop fasteners, ties, elastic closures, locks, alarms, etc.

Support 100 is an example of certain specific embodiments of articles for supporting a computer on a user's lap, for cooling the computer, for isolating the user from heat from the computer, or a combination thereof, as examples. In the embodiment illustrated, support 100 includes body 605 having top surface 110 for contacting computer 300 and bottom surface 120 for contacting the user's lap, for example. In the embodiment of support 100, body 605 defines hollow area 130 between top surface 110 and bottom surface 120. The embodiment of support 100 also includes (one) top aperture 112 extending through top surface 110 to hollow area 130, for example, to allow airflow between hollow area 130 and computer 300. Further, the embodiment of support 100 includes fan 111 positioned and configured to move air through top aperture 112 and past computer 300, and indentation 115 in top surface 110 to allow air to circulate by computer 300. In this particular embodiment, top aperture 112 extends through top surface 110 specifically from indentation 115 to hollow area 130, for example, to allow airflow between hollow area 130 and computer 130.

Further, the embodiment of article or support 100 includes a first side opening in the article (e.g., through end cap 650 in left side 150), for example, to allow air to circulate through hollow area 130 and through top aperture 112 past computer 300. In addition, the embodiment of support 100 further includes a second side opening in the article, (e.g., through end cap 620 in right side 250), which, as used herein, is opposite to the first side opening (e.g., through end cap 650 in left side 150), for example, to allow air to further circulate through hollow area 130. As mentioned, support 100 also includes, in the embodiment illustrated, back wall 140 extending from bottom surface 120 to top surface 110, and in the embodiment illustrated, back wall 140 includes rear opening 145 to hollow area 130, for example, to allow air to circulate through hollow area 130 and through top aperture 112 past computer 300, for instance.

In the example of support 100, body 605 includes, (e.g., is made of), foam, and article 100 includes fabric 610 covering at least a portion of body 605, as described herein. In some embodiments, fabric (e.g., 610) covers all of the foam (e.g., body 605), for instance, except where the foam (e.g., body 605) is covered with other components (e.g., liner 630). Further, in this embodiment, article 100 includes plastic liner 630, located within hollow area 130, plus end caps 620 and 650, which, alone or in combination, provide substantially increased stiffness to body 605. As used herein, in this context, providing substantially increased stiffness means reducing deflection by at least a factor of two, for at least one example of an external load applied to the article.

In the embodiment illustrated, article 100 has a front (e.g., where front wall 160 is located) and a back (e.g., where back wall 140 is located). In this embodiment, body 605 includes back wall 140 extending from bottom surface 120 to top surface 110 at the back of the article (e.g., where back wall 140 is shown in the drawings). Further, in the embodiment illustrated, body 605 includes and front wall 160 extending from bottom surface 120 to top surface 110 at the front of the article (e.g., where front wall 160 is shown in the drawings). In the embodiment illustrated, back wall 140 is taller than front wall 160, for example, so that top surface 110 is not parallel with bottom surface 120, or so that top surface 110 is not horizontal.

FIGS. 7 to 9 illustrate another embodiment of a laptop computer support, support 700. As shown in FIG. 9, support 700 includes top surface or portion 910, which may be made of plastic, and bottom surface or portion 920, which may be made of foam, for example. In some embodiments, bottom 920 may be coated in fabric (e.g., like fabric 610). In the embodiment illustrated, support 700 includes fan 111. Fan 111 may blow air from (or to) aperture 912 or between top 910 and bottom 920, in various embodiments. In the embodiment shown, aperture 912 extends downward through bottom 920 and draws air from (or blows air to) the lap area of the user, for example, that is then blown across back 320 of computer 300 (when computer 300 is sitting on support 700), for instance. In other embodiments, aperture 912 or bottom 920 include one or more passageways to the back, sides, or both, to draw or exhaust air to or from fan 111, for example. In the embodiment illustrated, top 910 includes recess or indentation 715 (e.g., similar to recess or indentation 115 described above) which may allow air from fan 111 to exhaust out (or be drawn from) the sides of support 700, for example.

Figure 10:
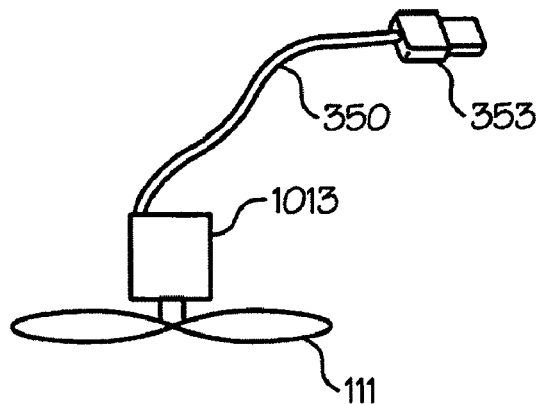
FIG. 10 is a detail side view of a fan, motor, cord, and plug that may be used in various embodiments of the invention.

FIG. 10 illustrates, as an example, fan 111, electric motor 1013, cord 350, and plug 353, which may be used in either the embodiment (e.g., support or article 100) illustrated in FIGS. 1-6 or the embodiment (e.g., support or article 700) illustrated in FIGS. 7-9. In the embodiment illustrated, fan 111 is an axial flow fan, and plug 353 is a USB plug, which may connect to a USB port in computer 300, for example.

In some embodiments, support 700 includes a storage area, for example, within bottom 920, for storing specific or various items. For example, in the embodiment illustrated, support 700 includes zipper pocket 845, which may be used, for instance, for storing USB cables, discs, a note pad, or the like. Further, in different embodiments, support 100, support 700, or the like, may include one or more of various electronic devices. Such supports may include, for example, a USB hub, a surge protector, power outlets, a battery charger, a power supply, an alarm, a motion sensor, a light, a mouse, trackball, or other pointer, one or more speakers, a docking port, a telephone, a remote control, a wireless router, a modem, a cable router, a disk drive, a DVD player (recorder, or both), memory, a cable retractor, a sensory stimulator (e.g., a device that produces vibrations, jerks, or the like, in conjunction or coordination with audiovisual stimuli), as examples.

Numerous embodiments of the invention are a support (e.g., 100 or 700) for a laptop computer (e.g., 300) that include a rigid structure (e.g., liner 630 or top 910) and a foam body (e.g., body 605 or bottom 920). Some such embodiments may include an aperture (e.g., 112 or 912), a recess or indentation (e.g., 115 or 715), or both (e.g., either alone or in combination). And some embodiments may include a fabric skin or covering (e.g., 610) surrounding some or all of the body (e.g., 605). In some embodiments, the structure is a core or liner (e.g., 630) for the support (e.g., 100), and the foam body (e.g., 605) surrounds the core or liner. In some embodiments, the core or liner (e.g., 630) includes or surrounds a hollow area (e.g., 130), for example. And in some embodiments that have a fabric skin (e.g., 610), end caps (e.g., 620 and 650) may snap into place to secure the fabric skin (e.g., 610).

Further, in some embodiments, the support (e.g., 100 or 700) includes a fan (e.g., 111). In certain embodiments, this fan (e.g., 111) may be positioned and configured, for example, to move air past a laptop computer (e.g., 300) that is sitting (e.g., as shown in FIGS. 3 and 4) on top of the support (e.g., 100 or 700). In certain embodiments, such a fan (e.g., 111) is configured to be powered by a USB port on the computer (e.g., on computer 300).

Other embodiments do not necessarily have such a structure (e.g., rigid structure and foam body), but rather are a support (e.g., 100 or 700) for a laptop computer (e.g., 300) that include such a fan (e.g., 111). Different embodiments may include a recess (e.g., 115 or 715). In some embodiments (in addition or instead), the body (e.g., 605) of the support (e.g., 100), the core or liner (e.g., 630), or both, is tubular, has substantially square ends (e.g., at the right side and the left side), has a cross section (e.g., when viewed from the right or left side) that is rectilinear, triangular, or trapezial, which may have rounded corners, has a cross section (e.g., when viewed from the front or back) that is rectilinear, trapezoidal, or an isosceles trapezoid, or a combination thereof. Some embodiments include an opening (e.g., 145) in the back (e.g., in wall 140). In other embodiments, other features described herein may distinguish the present invention from the prior art.

Among other things, FIGS. 1-9 illustrate at least two embodiments of articles (e.g., 100 and 700) for supporting computers (e.g., 300) that include a foam portion (e.g., body 605 or bottom 920), a plastic portion (e.g., 630, 620, 650, or a combination thereof, or 910) which provides substantially increased stiffness to the article (e.g., 100 or 700). These embodiments also include a top surface (e.g., 110 or 910), for example, for contacting the computer (e.g., 300) that has an indentation (e.g., 115 or 715), for example, to allow air to circulate by the computer (e.g., 300).

Both of these illustrated embodiments also include a bottom surface (e.g., 120 or 920), for example, for contacting the user's lap, (one) top aperture (e.g., 112 or 912) extending through the top surface (e.g., 110 or 910) to the indentation (e.g., 115 or 715), for instance, to allow airflow past the computer (e.g., 300), and fan 111, for example, positioned and configured to move air through the top aperture (e.g., 112 or 912) and past the computer (e.g., 300), for example. In various embodiments, the bottom surface (e.g., 120 or 920) may comprise or consist essentially of the foam or the foam portion (e.g., 605 or 920), as examples. And in some embodiments, the bottom surface (e.g., 120 or 920) may include the foam or foam portion (e.g., 605 or 920) covered with fabric (e.g., 610), as examples. Further, in different embodiments (e.g., article 100 or 700), the top surface may consist essentially of the plastic portion (e.g., 910), or the top surface (e.g., 110) may include the foam portion (e.g., 605) covered with fabric (e.g., 610), as further examples.

In various embodiments (e.g., 100 or 700) that have a fan (e.g., 111), the article (e.g., 100 or 700) may include an electric motor (e.g., 1013 shown in FIG. 10) connected to the fan (e.g., 111) and a USB cable (e.g., 350) electrically connected to the electric motor (e.g., 1013), for example. In some such embodiments, for example, the electric motor (e.g., 1013) may be configured to be powered through the USB cable (e.g., 350) when the USB cable (e.g., plug 353) is plugged into a USB port in the computer (e.g., 300), for instance. Further, in various embodiments that have an indentation (e.g., 115 or 715) in the top surface, the indentation (e.g., 115 or 715) may extend from the left side 150 to the right side 250 of the top surface (e.g., 110 or 910), for example.

Figure 11:
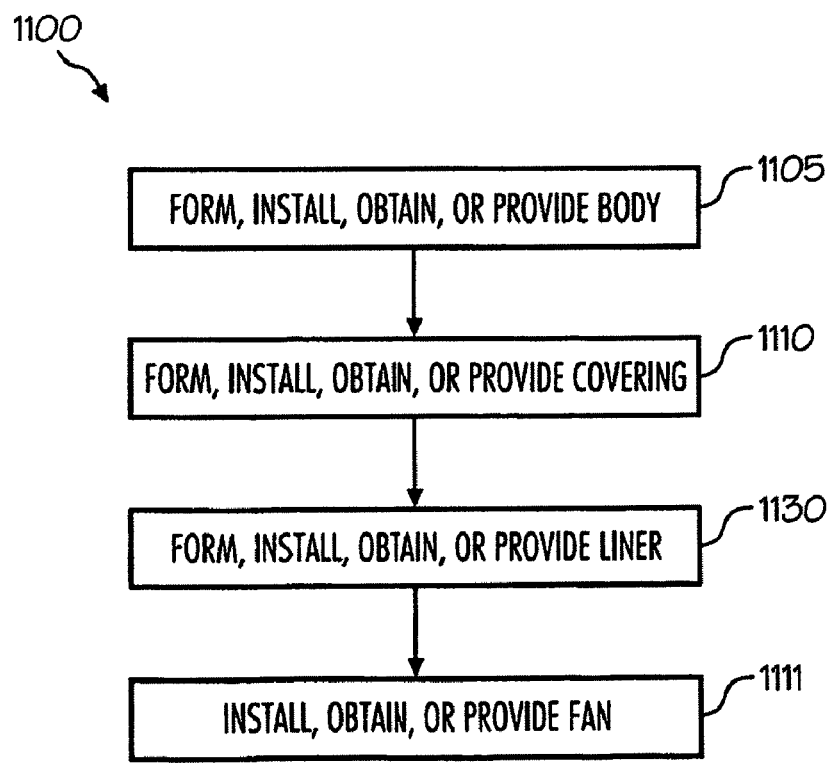
FIG. 11 is a flow chart that illustrates various embodiments of methods of manufacturing an article for supporting a computer in accordance with the invention.

Certain embodiments of the invention include processes or methods, wherein various articles, supports, or combinations of the elements described herein are manufactured, formed, obtained, provided, assembled, or a combination thereof, for example. For instance, method 1100 shown in FIG. 11 is an example of various methods of manufacturing (e.g., one or more) articles (e.g., 100) for supporting computers (e.g., 300) on users' laps, for example. Various methods may include specific acts, which may be performed in various orders, for example.

One such act, in method 1100, is act 1105 of forming, installing, obtaining, or providing a body, for example. Such a body may be a foam body (e.g., body 605 shown in FIG. 6) and may have a top surface (e.g., 110) for contacting the computer (e.g., 300) and a bottom surface (e.g., 120) for contacting the user's lap, for example. In some such embodiments, the body (e.g., 605) defines a hollow area (e.g., 130) between the top surface (e.g., 110) and the bottom surface (e.g., 120). Further, in some embodiments, the body (e.g., 605) includes at least one top aperture (e.g., 112) extending through the top surface (e.g., 110) to the hollow area (e.g., 130), for example, to allow airflow between the hollow area (e.g., 130) and the computer (e.g., 300). In particular embodiments, the body (e.g., 605) includes a side opening (e.g., 131, 132, or both)), a rear opening (e.g., 145), or a combination thereof, for instance, to allow air to circulate through the hollow area (e.g., 130) and through the top aperture (e.g., 112), for example.

Method 1100 further includes act 1110 of forming, installing obtaining, or providing a covering. Such a covering may be a fabric covering (e.g., 610), for example, which may cover at least a portion of the body (e.g., 605), for instance. In the embodiment illustrated, method 1100 also includes act 1130 of forming, installing, obtaining, or providing a liner. Such a liner may be a plastic liner (e.g., liner 630, end caps 620 or 650, or a combination thereof), which may be located within the hollow area (e.g., 130), and may provide substantially increased stiffness to the body (e.g., 605), for example. Further, in this embodiment, method 1100 further includes act 1111 of installing, obtaining, or providing a fan (e.g., 111). Such a fan (e.g., 111) may be positioned and configured to move air through the top aperture (e.g., 112) and past the computer (e.g., 300), for example.

Further still, in some embodiments, the act (e.g., 1111) of installing, obtaining, or providing the fan (e.g., 111) includes installing, obtaining, or providing an electric motor (e.g., 1013), for instance, connected to the fan (e.g., 111). Moreover, in some embodiments, the act (e.g., 1111) of installing, obtaining, or providing the fan (e.g., 111) includes installing, obtaining, or providing a USB cable (e.g., 350), which may be electrically connected to the electric motor (e.g., 1013) so that the electric motor (e.g., 1013) is configured to be powered through the USB cable (e.g., 350) when the USB cable (e.g., 350) is plugged into a USB port in the computer (e.g., 300), for example.

Even further, in some embodiments, act 1105 of forming, installing, obtaining, or providing the (e.g., foam) body (e.g., 605) includes forming, installing, obtaining, or providing a body (e.g., 605) having an indentation (e.g., 115) in the top surface (e.g., 110), for example, to allow air to circulate by the computer (e.g., 300). Furthermore, in a number of embodiments, act 1105 of forming, installing, obtaining, or providing the (e.g., foam) body (e.g., 605) includes forming, installing, obtaining, or providing a body (e.g., 605) having a first side opening (e.g., 131), for example, to allow air to circulate through the hollow area (e.g., 130) and through the top aperture (e.g., 112).

Moreover, in a number of embodiments, act 1105 of forming, installing, obtaining, or providing the (e.g., foam) body (e.g., 605) includes forming, installing, obtaining, or providing a body (e.g., 605) having a second side opening (e.g., 132), which may be opposite to the first side opening, for example, to allow air to circulate through the hollow area (e.g., 130), for instance. Furthermore, in some embodiments, act 1105 of forming, installing, obtaining, or providing the (e.g., foam) body includes forming, installing, obtaining, or providing a body (e.g., 605) having a rear opening (e.g., 145), for instance, to the hollow area (e.g., 130), for example, to allow air to circulate through the hollow area (e.g., 130) and through the top aperture (e.g., 112), as another example.

In various methods, supports (e.g., 100 and 700), features, or benefits described herein, or a combination thereof, may be advertised, displayed, sold, or a combination thereof, for instance, through retail establishments, through the Internet, or in locations where computers or computer peripheral devices (or both) are advertised or sold. Certain embodiments may include the laptop computer (e.g., 300), which may be sold separately, or together as part of a kit, for example. Other embodiments may be apparent to a person of ordinary skill in the art having studied this document, and may include features or limitations described herein, shown in the drawings, or both. Various embodiments of the invention include various combinations of the acts, structure, components, and features described herein or shown in the drawings. The invention also contemplates various means for accomplishing the various functions and acts described herein or apparent from the structure and acts described.

What is claimed is:

1. An article for supporting a computer and for cooling the computer, the article comprising:
   a tubular foam portion;
   a plastic portion which provides stiffness to the article;
   a top surface;
   a bottom surface, wherein the top surface of the article is at an acute angle to the bottom surface;
   an air volume between the top surface and the bottom surface and between top and bottom regions of the tubular foam portion;
   at least one top aperture extending through the top surface and the top region of the tubular foam portion to the air volume;
   two side openings coupled to the air volume; and
   a fan positioned and configured to move air through the at least one top aperture, into or out of the air volume, and into or out of the two side openings to cool the computer when the article supports the computer.

2. The article of claim 1 further comprising fabric covering the foam portion, wherein the bottom surface comprises the fabric.

3. The article of claim 1, wherein the air volume is lined by the plastic portion.

4. The article of claim 1 further comprising an electric motor connected to the fan, wherein the electric motor is powered through a USB cable when the USB cable is plugged into a USB port in the computer.

5. The article of claim 4 further comprising a back wall extending from the top surface to the bottom surface, wherein the USB cable passes through the back wall when the USB cable powers the electric motor by being plugged into a USB port in the computer.

6. The article of claim 1 wherein the fan is located within or adjacent to the top aperture.

7. The article of claim 1 wherein top surface comprises the foam portion covered with fabric and the at least one top aperture extends through the fabric, through the foam portion, and through the plastic portion to allow airflow to or from the computer when the article supports the computer.

8. The article of claim 1 further comprising fabric covering the foam portion, wherein the top surface comprises the fabric.

9. An article for supporting a computer and for cooling the computer, the article comprising:
 a top surface comprising a fabric;
 a bottom surface comprising the fabric, wherein the top surface is at an acute angle to the bottom surface, and wherein the bottom surface is devoid of any apertures;
 an air volume between the top surface and the bottom surface;
 a plastic portion located between the top surface and the bottom surface and forming a closed shape, wherein the air volume is lined by top and bottom regions of the plastic portion and wherein the plastic portion provides stiffness for the article;
 a left side aperture located between the top and bottom surfaces and between the top and bottom regions of the plastic portion and extending to the air volume, and a right side aperture located between the top and bottom surfaces and between the top and bottom regions of the plastic portion and extending to the air volume, and at least one top aperture extending through the top surface and through the top region of the plastic portion to the air volume to allow airflow between the air volume and the computer when the article supports the computer;
 a fan positioned between the top and bottom surfaces and configured to move air through the at least one top aperture, the left side aperture, and the right side aperture to cool the computer when the article supports the computer; and
 an electric motor located between the top and bottom surfaces and coupled to the fan.

10. The article of claim 9 wherein closed shape has a cross section that is a quadrilateral, a trapezium, or a triangle, and which has rounded corners and substantially square ends at the left and right side apertures.

11. The article of claim 9 further comprising a USB cable electrically coupled to the electric motor, wherein the electric motor is configured to be powered through the USB cable when the USB cable is plugged into a USB port in the computer, and wherein the USB cable passes through a passageway in the plastic portion.

12. The article of claim 9 further comprising a foam portion between the top surface and the top region of the plastic portion and between the bottom surface and the bottom region of the plastic portion.

13. The article of claim 12 wherein the foam portion comprises a closed-cell foam.

14. The article of claim 12 wherein the plastic portion is more rigid than the foam portion.

15. The article of claim 9 wherein the plastic portion has a cross section, when viewed from a right side or a left side, that has rounded corners.

16. The article of claim 9 wherein the article has a front and a back and the plastic portion comprises (a) a back wall extending from the bottom surface to the top surface at the back of the article and (b) a front wall extending from the bottom surface to the top surface at the front of the article, wherein the back wall is taller than the front wall.

17. A method of manufacturing an article for supporting a computer, the method comprising in any order at least the acts of:
 forming, installing, obtaining, or providing a top surface comprising a fabric;
 forming, installing, obtaining, or providing a bottom surface comprising the fabric;
 forming, installing, obtaining, or providing an air volume between the top surface and the bottom surface;
 forming, installing, obtaining, or providing a plastic portion located between the top surface and the bottom surface and forming a closed shape, wherein the air volume is lined by top and bottom regions of the plastic portion and wherein the plastic portion provides stiffness for the article;
 forming, installing, obtaining, or providing a left side aperture located between the top and bottom surfaces and between the top and bottom regions of the plastic portion and extending to the air volume, and a right side aperture located between the top and bottom surfaces and between the top and bottom regions of the plastic portion and extending to the air volume, and at least one top aperture extending through the top surface and through the top region of the plastic portion to the air volume to allow airflow between the air volume and the computer when the article supports the computer;
 forming, installing, obtaining, or providing a fan positioned between the top and bottom surfaces and configured to move air through the at least one top aperture, the left side aperture, and the right side aperture to cool the computer when the article supports the computer; and
 forming, installing, obtaining, or providing an electric motor located between the top and bottom surfaces and electrically coupled to the fan.

18. The method of claim 17 further comprising forming, installing, obtaining, or providing a foam portion between the top surface and the top region of the plastic portion and between the bottom surface and the bottom region of the plastic portion.

19. The method of claim 17 further comprising forming, installing, obtaining or providing a USB cable electrically coupled to the electric motor, wherein the electric motor is configured to be powered through the USB cable when the USB cable is plugged into a USB port in the computer, and wherein the USB cable passes through a passageway in the plastic portion.

20. The method of claim 17 wherein two or more of the following acts occur simultaneously with each other:
 forming, installing, obtaining, or providing the top surface comprising the fabric;
 forming, installing, obtaining, or providing the bottom surface comprising the fabric;
 forming, installing, obtaining, or providing the air volume between the top surface and the bottom surface; or
 forming, installing, obtaining, or providing the left side aperture located between the top and bottom surfaces and between the top and bottom regions of the plastic portion and extending to the air volume, and the right side aperture located between the top and bottom surfaces and between the top and bottom regions of the plastic portion and extending to the air volume, and at least one top aperture extending through the top surface and through the top region of the plastic portion to the air volume to allow airflow between the air volume and the computer when the article supports the computer.

21. The method of claim 17 wherein two or more of the following acts occur simultaneously with each other:

forming, installing, obtaining, or providing the air volume between the top surface and the bottom surface;

forming, installing, obtaining, or providing the plastic portion located between the top surface and the bottom surface and forming the closed shape, wherein the air volume is lined by top and bottom regions of the plastic portion and wherein the plastic portion provides stiffness for the article; or forming, installing, obtaining, or providing the left side aperture located between the top and bottom surfaces and between the top and bottom regions of the plastic portion and extending to the air volume, and the right side aperture located between the top and bottom surfaces and between the top and bottom regions of the plastic portion and extending to the air volume, and at least one top aperture extending through the top surface and through the top region of the plastic portion to the air volume to allow airflow between the air volume and the computer when the article supports the computer.

\* \* \* \* \*